United States Patent
Spinks

(10) Patent No.: US 9,754,656 B2
(45) Date of Patent: Sep. 5, 2017

(54) MASTER/SLAVE CONTROL VOLTAGE BUFFERING

(71) Applicant: Intel Corporation, Santa Clara, CA (US)

(72) Inventor: Stephen J. Spinks, Swindon (GB)

(73) Assignee: Intel Corporation, Santa Clara, CA (US)

( * ) Notice: Subject to any disclaimer, the term of this patent is extended or adjusted under 35 U.S.C. 154(b) by 673 days.

(21) Appl. No.: 13/929,967

(22) Filed: Jun. 28, 2013

(65) Prior Publication Data
US 2015/0003176 A1    Jan. 1, 2015

(51) Int. Cl.
G11C 7/00 (2006.01)
G11C 11/4076 (2006.01)
G06F 1/10 (2006.01)
H03L 7/081 (2006.01)

(52) U.S. Cl.
CPC ............ *G11C 11/4076* (2013.01); *G06F 1/10* (2013.01); *H03L 7/0812* (2013.01)

(58) Field of Classification Search
CPC ........ G11C 11/4076; G06F 1/10; G06F 13/42
USPC .......................... 365/191, 194, 233.1, 233.13
See application file for complete search history.

(56) References Cited

U.S. PATENT DOCUMENTS

| | | | |
|---|---|---|---|
| 6,377,511 B1 * | 4/2002 | Okuda | G11C 5/025 365/191 |
| 6,744,277 B1 * | 6/2004 | Chang | H03L 7/0896 326/37 |
| 7,482,844 B2 * | 1/2009 | Brady | G11C 7/14 327/415 |
| 2006/0170468 A1 * | 8/2006 | Takahashi | H03L 7/0893 327/156 |

* cited by examiner

*Primary Examiner* — Tha-O H Bui
(74) *Attorney, Agent, or Firm* — Green, Howard, & Mughal LLP

(57) ABSTRACT

In some embodiments, disclosed herein are approaches for facilitating voltage controlled slaved (or replica) clock circuits such as voltage controlled delay lines (VCDLs) off of a master clock generator. In such systems, one or more control (or bias) voltages are generated to control a master clock generator such as a master DLL. One or more "slave" circuits may be controlled off of the master's control voltage so that their clocks replicate desired traits of the master clock.

15 Claims, 3 Drawing Sheets

MASTER/SLAVE CONTROL VOLTAGE BUFFERING

TECHNICAL FIELD

Some embodiments relate generally to circuits for buffering analog control voltages.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In some embodiments, disclosed herein are approaches for facilitating voltage controlled slaved (or replica) clock circuits such as voltage controlled delay lines (VCDLs) off of a master clock generator. In such systems, one or more control (or bias) voltages are generated to control a master clock generator such as a master DLL. One or more "slave" circuits may be controlled off of the master's control voltage so that their clocks replicate desired traits of the master clock.

Systems typically use buffers to provide the control voltages to the slave clk circuits so that the master control voltage is not detrimentally loaded down or otherwise altered. Unfortunately, buffer characteristics can fluctuate, depending on design, and process, voltage and temperature fluctuations, so trimming functionality is ideally provided to make adjustments as needed. Traditional buffer trimming methods commonly use voltage domain approaches such as is well known with the use of comparators and reference voltages. However, such methods usually require excessive analog circuitry and rely on voltage accuracy. Accordingly, improved approaches would be desired.

In some embodiments, buffers using current mirrors may be used to provide reasonably accurate high input/low output impedance buffers for generating master control voltage copies without unduly loading the control voltage themselves. Moreover, in some embodiments, trimming approaches, e.g., using time-domain, rather than voltage-domain, comparisons may be employed. Such approaches may be used, for example, for master/slave DLLs in memory interfaces such as in DDR memory interface circuits.

Figure 1:
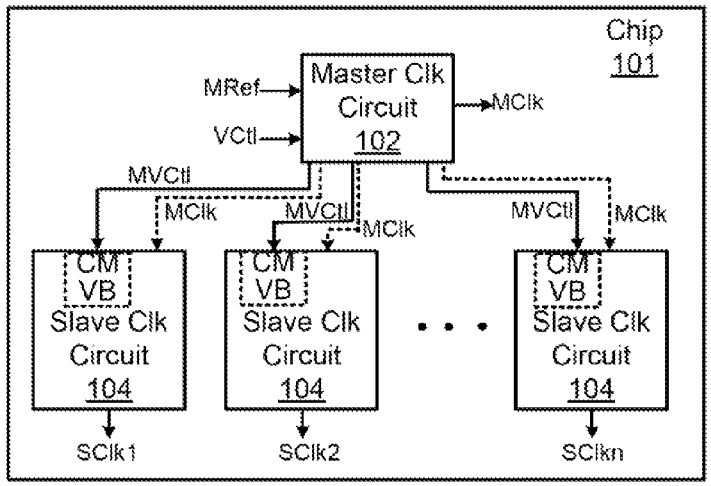
FIG. 1 is a diagram generally showing a master-slave clock generation system using voltage controlled delay lines in accordance with some embodiments.

FIG. 1 generally shows a chip 101 with a master/slave dock distribution network. The chip may correspond to any suitable chip that uses slave clock signals whose circuits that in some way are controlled by voltage control signals from a master clock circuit. The master clock circuits could include PLLs, DLLs, clock buffers, or the like, and in turn, the slave clock circuits could include voltage controlled oscillators, voltage controlled delay lines, voltage controlled drivers, clock buffers, etc. The control voltages may be used to control the strengths of drivers or delay stages. for example, as discussed below, they could be used to control delay stages in delay lines, with a master control voltage used to control delay elements in slave delay lines so that the slave delay lines match the master DLL delay lines. Similarly, the chip could correspond to any device using clock networks and/or DLL/PLL master/slave systems. For example, the chip could be a smart device SoC (system on chip), a processor, a memory hub, a micro-controller, or the like.

Chip 101 has a master clock generator 102 to generate a master clock (MClk) and to provide control voltage signals (MVctl) from a control voltage used by the master Clk generator 102 to control slave clock circuits 104 as shown. Each slave circuit may have a current mirrored voltage buffer (CMVB) to buffer the master control voltage for use in the slave circuitry. (It should be appreciated that one buffer may service one or more slave delay lines. For example, a single current mirror buffer might provide control voltages for 20 slave delay lines.) The voltage buffer should buffer the master control voltage line from the master circuit so as to avoid loading the master clocking circuitry with capacitance from the slave circuits, which could affect master clock parameters. (For example, in a master DLL loop, excessive loading could alter the response and lock time of the delay locked loop.)

Current mirror voltage buffers (discussed further below with reference to FIG. 4) can function well because they provide relatively high input and low output impedances. In some embodiments, current mirror elements (e.g., digitally controlled current legs) may be trimmed using time domain measurements on the slave circuits based on a master clock (MClk) signal. It should be appreciated that while each slave circuit is shown with an MClk signal coupled to it, in some embodiments, only one, or a few, of the slave circuits could be used to trim the buffers (e.g., trim current mirrors) in each slave circuit to reduce circuit area overhead. The trim could be done once, or periodically if the slave circuit has idle time.

Figure 2:
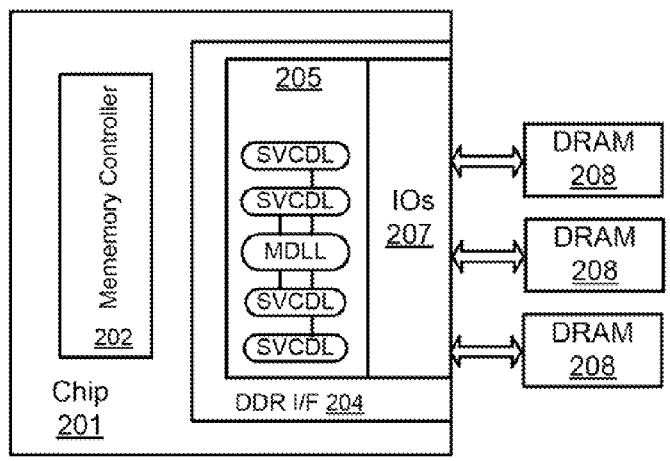
FIG. 2 is a diagram generally showing a DDR system with master DLL and slave VCDLs in accordance with some embodiments.

FIG. 2 is a diagram showing a chip 201 with a DDR interface having a master/slave DLL implementation in accordance with some embodiments. For example, a master DLL with slave VCDLs having current mirror buffers and/or time domain trimming may be used to support DDR memory interface SoC technologies using a master analog DLL to generate digital clock phases and control voltages for one or more slave delay lines. The depicted chip 201 (e.g., SoC, processor, hub, or other) includes a memory controller 202, DDR interface (I/F) 204, and external DRAM modules 208 coupled to the DDR interface 204. The DDR interface includes IOs (input/output circuitry) 207 and clock circuitry 205, which among other things, includes a master DLL (MDLL) and slave VCDLs (SVCDL) to provide to the IOs the differently phased clocks used to control IO operations (e.g., writing data into and reading data out of the DRAM 208). It should be appreciated that the depicted clocking circuitry 205 represents the DDL/VCDL blocks but omitted, for clarity, would likely be other clock elements such as PLLs, clock circuits, buffers, etc. For example, each VCDL may be driven by separate or common clock circuits, typically at least synchronized with each other and with the master DLL clock.

Figure 3:
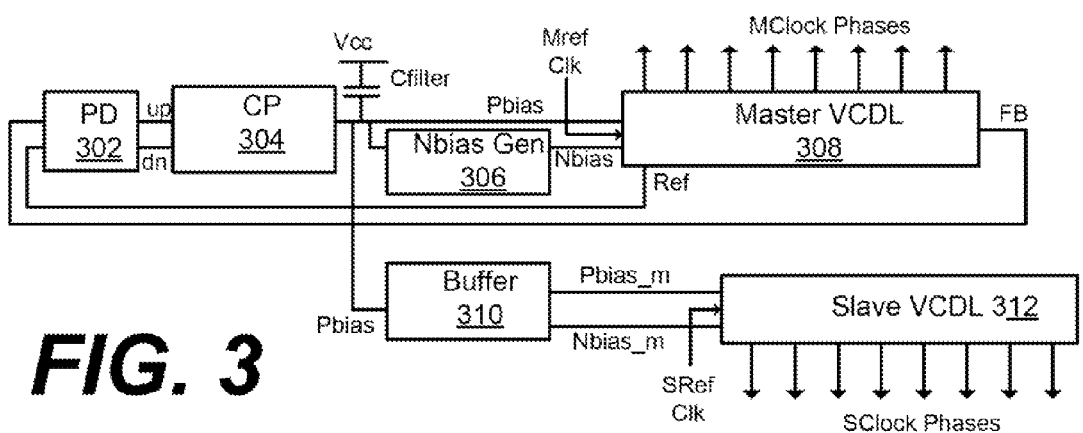
FIG. 3 is a diagram of a master DLL and slave delay line with buffered control voltage in accordance with some embodiments.

FIG. 3 illustrates a master DLL/slave VCDL circuit (a.k.a. master/slave DLL circuit) in accordance with some embodiments. The circuit includes phase detector (PD) 302, charge pump (CP) 304, loop filter (Cfilter), Nbias generator (Nbias) 306, master VCDL 308, buffer 310, and slave VCDL (SVCDL) 312, all coupled as shown. The PD, CP, loop filter, bias generator, an MVCDL are coupled to form a delay locked loop with an input reference clock (Mref Clk) and a number of output clock options (MClock Phases) having different relative phases, based off of the Mref Clk.

The loop functions to force the Ref clk (corresponding to the input Mref Clk) and the FB clk (corresponding to any desired phase option, likely the last one) to be in phase with one another.

The MVCDL 308 will typically include a number of chained (sequentially coupled) delay stages (not shown here, see FIGS. 4 and 5) whose strengths are controlled by the magnitudes of the Pbias and Nbias voltages, which in turn are controlled by the charge pump and phase detector. (Note that in the depicted embodiment, the voltage controlled delay lines, master and slave VCDLs, use Pbias and Nbias voltages to control their delay stage strengths. The Nbias voltage is generated by the Nbias generator 306 off of the Pbias voltage. It should be appreciated, however, that with other designs utilizing principles disclosed herein, such Pbias and Nbias control voltages may not be required. For example, only one control voltage or more than two control voltages could be used.) With the loop closed, the phase detector and charge pump operate by increasing or decreasing the Pbias strength, depending on the difference (magnitude and direction) between the phases of the Ref and FB clocks, until they are sufficiently the same. (Once this occurs, the loop is said to be "locked."

In the depicted embodiment, the Pbias voltage functions as a control voltage to be used to control the slave VCDL 312. It is buffered through buffer 310, which also generates an Nbias voltage for the slave VCDL. So, the buffer provides Nbias and Pbias control voltages (Pbias_m and Nbias_m) to slave VCDL 312 for controlling its delay stage in accordance with the delay stages of Master VCDL 308. The Npbias_m and Pbias_m voltages are used by the slave VCDL, with its delay line elements matching those of the master delay line, such that when the master delay line is locked, the delay in the slave delay line should match the master.

In a DDR implementation, there would likely be multiple slave delay lines 312, with each being coupled to an associated buffer 310. (Depending on design specifics, a buffer could source one or more slave delay lines.) The Mref Clk could correspond to the so-called "2x" DDR clock. The master DLL would generate delay locked clock phases (MClock Phases), which could be used, for example, in the transmit path of the memory I/O interface. Likewise, the slave delay lines would typically be used in the receive path of the interface where a defined reference clock is not always present.

Figure 4:
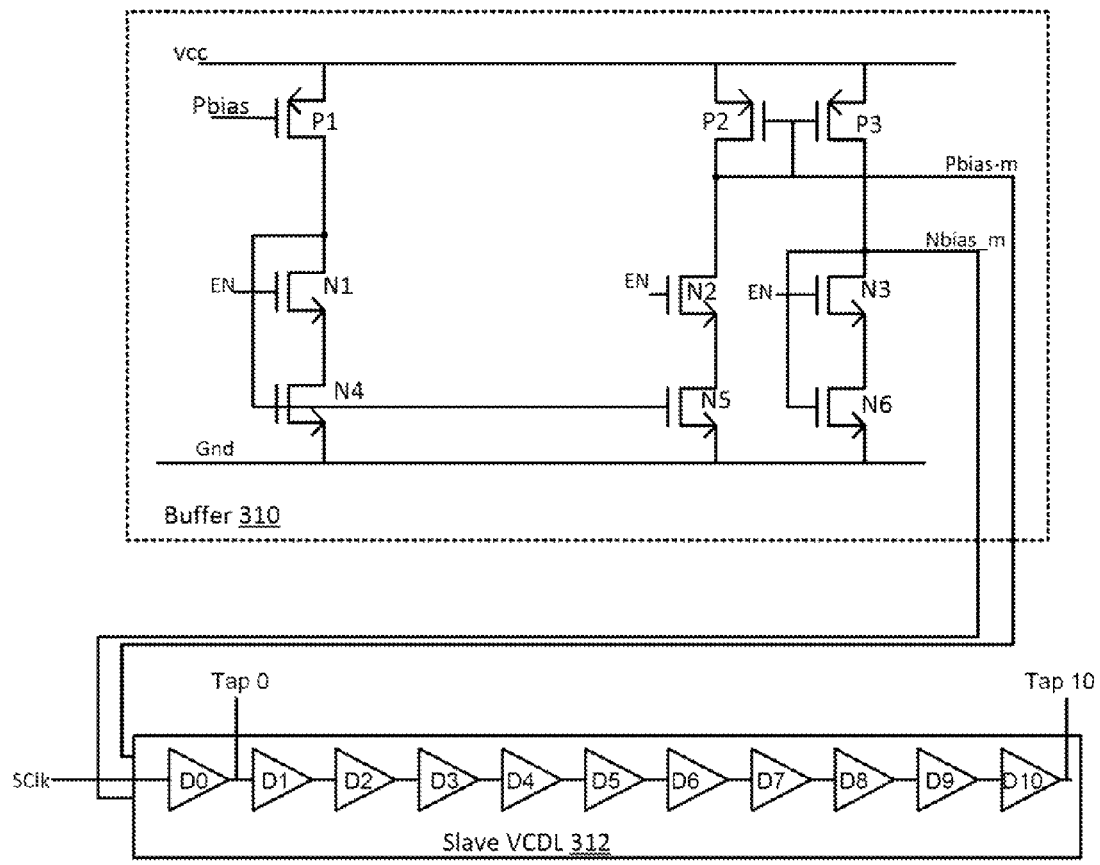
FIG. 4 is a diagram showing buffered slave control voltages generated by a current mirror approach in accordance with some embodiments.

FIG. 4 is a schematic diagram showing an implementation for buffer 310 and slave VCDL 312 in accordance with some embodiments. Buffer 310 comprises PMOS transistors (P1-P3) and NMOS transistors (N1-N6) coupled together as shown. For circuit understanding purposes, devices N1 to N3 can generally be ignored since they simply function as switches to enable or disable the buffer. It should also be appreciated that in the depicted embodiment, the left-side leg (P1-N1-N4) is ratio matched to the right-side legs (P2-N2-N5, and P3-N3-P6), with the right-side legs being larger (stronger). Devices N4 and N5 are in a current mirror configuration, so the current generated by P1 (which is determined by Pbias) will be "mirrored" through the P2-N2-N5 leg, albeit multiplied in accordance with the ratio between the legs. Since they are matched as they are, the Pbias_m voltage will mirror (or should mirror) the Pbias voltage. Also, since P2-P3, N2-N3, and P5-P6 are matched to counterparts in the Nbias generator 306, the Nbias-M voltage should mirror the Nbias voltage of FIG. 3. The Pbias-m voltage, if the devices are perfectly matched, will be the same voltage as Pbias, although the ratio'd right-side legs will be bigger, providing the buffer with a low Z drive (low output impedance).

The slave VCDL 312 includes 11 delay stages (D0-D10) chained together as shown, providing 11 tap outputs (Tap 0 to Tap 10). The strength, and thus the delay interval, for each delay stage is controlled by the Pbias_m and Nbias_m control voltages, which are generated by the buffer as shown. For example, certain PMOS drive-strength devices could be controlled by the Pbias_m voltage, while certain NMOS drive-strength devices could be controlled b the Nbias voltage.

Figure 5:
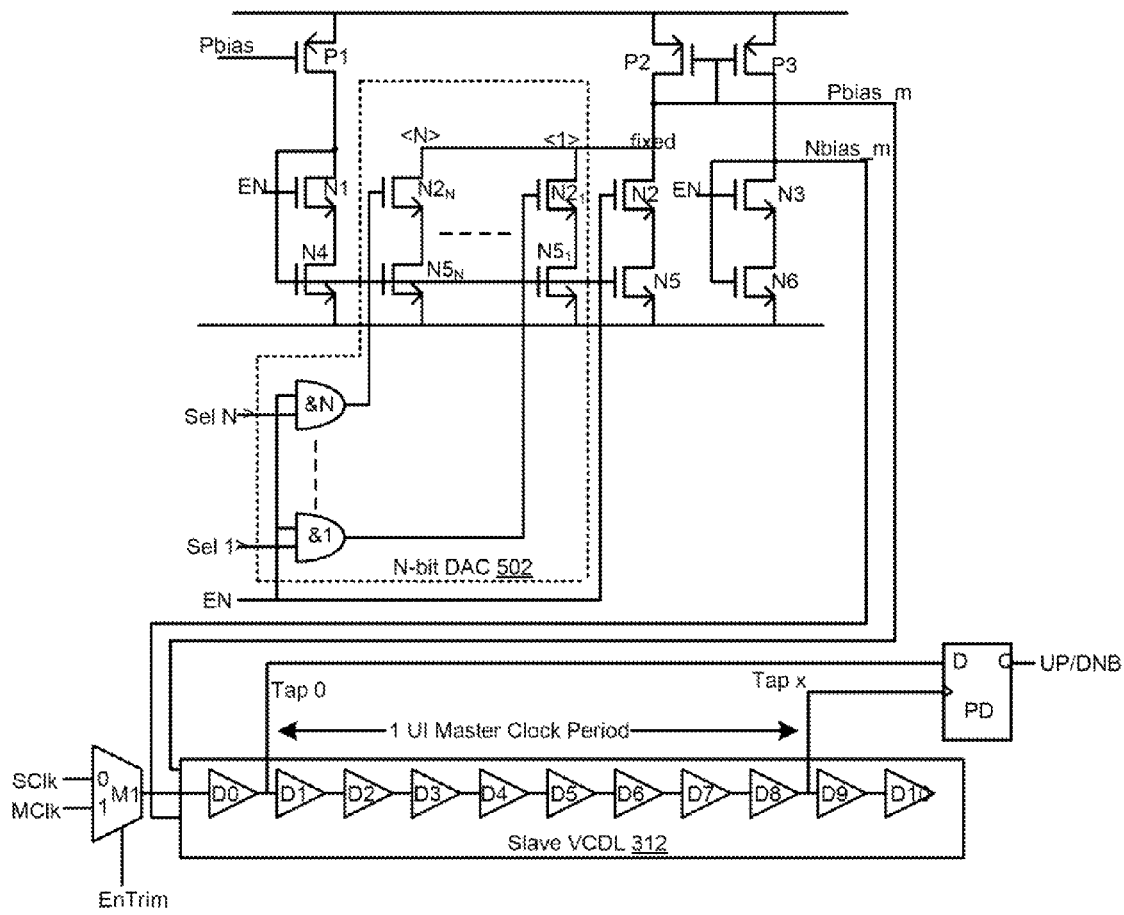
FIG. 5 is a diagram showing buffered slave control voltages generated using a current mirror approach with time-based DAC trim in accordance with some embodiments.

Due, among other things, to process mismatch, the buffer 310 will unfortunately likely have an offset associated with it such that the Pbias_m and Nbias_m slave outputs will not exactly match the Pbias and Nbias voltages. IN turn, this would cause the slave delay lines to deviate from the master delay line. FIG. 5 shows a buffer with circuitry for trimming the buffer using a current weighted DAC.

FIG. 5 shows a buffer and slave VCDL with current trimming in accordance with some embodiments. This buffer corresponds to the buffer of FIG. 4, except that this buffer further includes n-bit DAC 502 added to the current mirror circuit, an input max (M1) coupled to the slave delay line for selecting as an input either the slave or master clocks (SClk, MClk), and a phase detector (PD) with inputs from Tap 0 and Tap X. The DAC is formed from current legs (N21/N51 to N2N/N5N) and digital input selection switches formed from AND gates (&1 to &N). The buffer may be trimmed in the following manner.

The master clk (MClk) is selected for input to the slave delay line using the En Trim control. The phase detector output (UP/DNB) is monitored. The DAC trim code (Sel 1:Sel N) is controlled (started at an initial value and then raised or lowered) according to the UP/DNB phase detector output. For example, a binary trim or a linear sweep approach could be used. Adjustment of the digital code is stopped when the UP/DNB changes, indicating that the Tap 0 and Tap X signals are 360 degrees out of phase from one another. (The Tap X delay output should generally be selected so that the resulting delay stage interval, eight stages in this example, corresponds to the length of the utilized master delay line.) Finally, the Mux, is switched so that the slave delay line dock (SClk) is input to the slave delay line for normal operation. With this approach, the delay between Tap 0 and Tap X from the slave delay line will be trimmed to one master clock period.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, the are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS., for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
    a Delay Locked Loop (DLL) circuit;
    a voltage buffer coupled to the DLL circuit to generate an output control voltage to mirror an input control voltage coming from the DLL circuit, the voltage buffer having a current mirror to generate the output control voltage; and
    a slave delay line coupled to the voltage buffer to be controlled by the output control voltage.

2. The chip of claim 1, in which the voltage buffer includes a digital to analog converter (DAC) with selectable current legs to trim the output control voltage.

3. The chip of claim 2, including a circuit with a phase detector to compare first and second taps of the slave delay line for trimming the DAC.

4. The chip of claim 3, in which the circuit has a mux to couple a clock from the DLL circuit to the slave delay line.

5. The chip of claim 4, in which the time interval between the first and second taps corresponds to a period of the clock.

6. The chip of claim 1, in which the voltage buffer is to generate nbias and pbias control voltages.

7. An apparatus, comprising:
    a memory interface having a master Delay Locked Loop (DLL) with a control voltage;
    a voltage buffer coupled to the master DLL to provide a buffered control voltage off of the control voltage, the voltage buffer having a current mirror with an output leg that is larger than an input leg; and
    one or more slave delay lines coupled to the voltage buffer to receive the buffered control voltage to control the one or more slave delay lines.

8. The apparatus of claim 7, in which the voltage buffer has digitally controlled current legs in parallel with the output leg.

9. The apparatus of claim 7, in which the memory interface is a Double Data Rate (DDR) interface.

10. The apparatus of claim 7, comprising a circuit to determine when the one or more slave delay lines have delay intervals matching a delay interval of the master DLL.

11. The apparatus of claim 10, in which the circuit includes a phase detector to monitor first and second taps from a selected one of the slave delay lines when a master DLL clock is driven through it.

12. The apparatus of claim 11, in which the phase detector includes a flip-flop circuit.

13. A method, comprising:
    providing a current mirror voltage buffer to buffer a control voltage from a master Delay Locked Loop (DLL) to a slave delay line; and
    trimming the current mirror voltage buffer by adjusting its buffered control voltage until a phase relationship between first and second slave delay taps changes.

14. The method of claim 13, comprising providing a clock from the master DLL to the slave delay line while trimming the buffer voltage.

15. The method of claim 14, including changing a slave delay clock from the master DLL clock to an operational clock once the phase relationship has changed.

* * * * *